United States Patent
Yuan et al.

(10) Patent No.: US 12,045,096 B2
(45) Date of Patent: Jul. 23, 2024

(54) SELF-CLAMPING SHELL MEMBERS NOT REQUIRING EXTERNAL HOLDING PRESSURE AND ELECTRONIC DEVICE

(71) Applicants: Zhengzhou Wanmayun Electronic Technology CO., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Bo-Duo Yuan, Shenzhen (CN); Yan-Lei Cao, Zhengzhou (CN)

(73) Assignees: Zhengzhon Wanmayun Electronic Technology CO., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 127 days.

(21) Appl. No.: 17/720,455

(22) Filed: Apr. 14, 2022

(65) Prior Publication Data
US 2023/0213980 A1   Jul. 6, 2023

(30) Foreign Application Priority Data
Jan. 4, 2022   (CN) .......................... 202210002595.9

(51) Int. Cl.
*G06F 1/16*   (2006.01)
*H05K 5/00*   (2006.01)
(Continued)

(52) U.S. Cl.
CPC .......... *G06F 1/1679* (2013.01); *G06F 1/1656* (2013.01); *H05K 5/0013* (2013.01); *G06F 2200/1633* (2013.01)

(58) Field of Classification Search
CPC .. H04M 1/026; H04M 1/0266; H04M 1/0249; H04M 1/0252; H04M 1/0202;
(Continued)

(56) References Cited

U.S. PATENT DOCUMENTS 7,907,394 B2 *   3/2011   Richardson ........... G06F 1/1613
                                                361/679.02
8,148,633 B2 *   4/2012   Hung ................... H04M 1/0252
                                                174/559
(Continued)

*Primary Examiner* — Adrian S Wilson
*Assistant Examiner* — Gage Crum
(74) *Attorney, Agent, or Firm* — ScienBiziP, P.C.

(57) ABSTRACT

A two-parts shell or housing assembly not requiring a pressure jig for assembly includes an upper shell and a lower shell. The upper shell includes a first surface and a second surface. Hooks are disposed on edges of the second surface. The lower shell includes an inner bottom surface and a first blocking surface. A stepped portion is formed at the connection portion between the inner bottom surface and the first blocking surface. The stepped portion includes a first side and a second side. The upper shell is disposed on the second side. The first side defines slots corresponding to the hooks. A receiving space is formed by the hook, the stepped portion, and the second side for receiving adhesive. An electronic device is also provided.

10 Claims, 5 Drawing Sheets

(51) Int. Cl.
*H05K 7/12* (2006.01)
*H05K 7/14* (2006.01)

(58) Field of Classification Search
CPC ...... H04M 1/04; H04M 1/185; H05K 5/0013; G06F 1/1601; G06F 1/1626; G06F 1/1637; G06F 1/1679; G06F 2200/1633; G06F 1/1656; H04B 2001/3894; H04B 1/3888; H04B 1/3833; H04B 1/38
See application file for complete search history.

(56) References Cited

U.S. PATENT DOCUMENTS

| | | | | |
|---|---|---|---|---|
| 8,531,834 B2* | 9/2013 | Rayner | ................. | G06F 1/1626 |
| | | | | 455/575.8 |
| 9,549,598 B2* | 1/2017 | Rayner | ................. | A45C 13/008 |
| 2013/0126372 A1* | 5/2013 | Song | ................. | G06F 1/1626 |
| | | | | 206/320 |
| 2015/0341072 A1* | 11/2015 | Lai | ................. | H04B 1/3888 |
| | | | | 455/575.8 |
| 2016/0366996 A1* | 12/2016 | Chao | ................. | H05K 5/0017 |

\* cited by examiner

SELF-CLAMPING SHELL MEMBERS NOT REQUIRING EXTERNAL HOLDING PRESSURE AND ELECTRONIC DEVICE

CROSS-REFERENCE TO RELATED APPLICATIONS

This application claims priority to Chinese patent application No. 202210002595.9, filed on Jan. 14, 2022, in China National Intellectual Property Administration, which are incorporated herein by reference in its entirety.

FIELD

The subject matter herein generally relates to housing manufacture, specifically relates to a shell assembly not needing holding pressure for assembling different components together.

BACKGROUND

Due to requirements for waterproofing, shakeproofing, and protection against impact, an exterior shell to receive display panel and components must be of high strength. The shell includes the front and back shell halves being fixed and sealed through a dispensing machine. A jig applying a holding pressure ensures that glue dispensed between the two halves can solidify under a stable state. It is a complex process for fixing the holding pressure jig and cost of manufacture is increased.

There is room for improvement in the art.

BRIEF DESCRIPTION OF THE FIGURES

Implementations of the present disclosure will now be described, by way of example only, with reference to the attached figures.

DETAILED DESCRIPTION

The present disclosure is described with reference to accompanying drawings and the embodiments. It will be understood that the specific embodiments described herein are merely part of all embodiments, not all the embodiments. Based on the embodiments of the present disclosure, it is understandable to a person skilled in the art, any other embodiments obtained by persons skilled in the art without creative effort shall all fall into the scope of the present disclosure.

The relationships of orientations or positions denoted by the terms of "center", "longitudinal", "lateral", "length", "width", "thickness", "up", "down", "left", "right", "horizontal", "left", "top", "bottom", "inside", "outside", "clockwise", "anticlockwise" used herein refer to those illustrated in the accompany drawings, which are only for conveniently describing the invention and simplifying the description, rather than indicating or implying that a device or member has to be in a specific orientation or configured or operated in a specific orientation. In addition, the terms "first" and "second" are for the purpose of describing only and should not be constructed to indicate or imply the relative importance. In the present disclosure, the term "some" means two or more than two, unless otherwise expressly stated.

In the present disclosure, unless otherwise expressly stated, the terms "mounted", "link", and "connect" should be understood broadly, unless otherwise specified and defined, for example, they may be a fixed connection or a removable connection, they may be mechanical connection or electrical connection, and also inner communication between two members, they may be a direct connection, and can also be an indirect connection via a medium, the skilled persons in the art will understand the meanings of above terms according to specific situations.

In the present disclosure, unless otherwise expressly stated, a structure in which a first feature is "on" or "below" a second feature may include an embodiment in which the first feature is in direct contact with the second feature, and may also include an embodiment in which the first feature and the second feature are not in direct contact with each other, but have an additional feature formed therebetween. Furthermore, a first feature "on," "above," or "on top of" a second feature may include an embodiment in which the first feature is right or obliquely "on," "above," or "on top of" the second feature, or may mean that the first feature is at a height higher than that of the second feature; while a first feature "below," "under," or "on bottom of" a second feature may include an embodiment in which the first feature is vertically or obliquely "below," "under," or "on bottom of" the second feature, or may mean that the first feature is at a height lower than that of the second feature.

Figure 1:
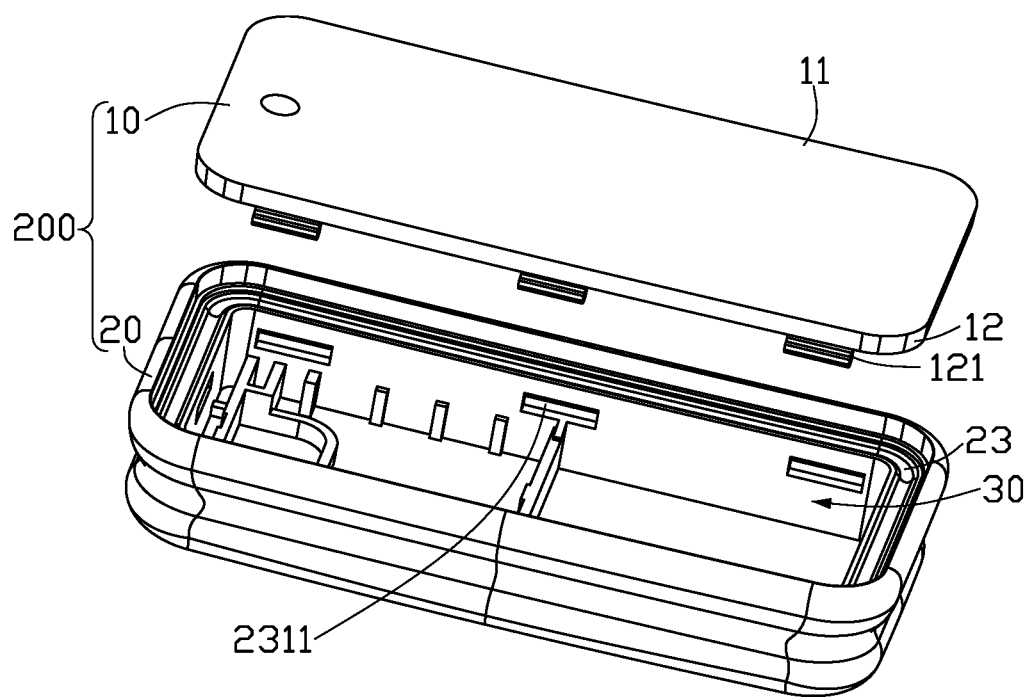
FIG. 1 is an exploded view of an electronic device according to the present disclosure, the electronic device comprising an upper shell and a lower shell.
Figure 4:
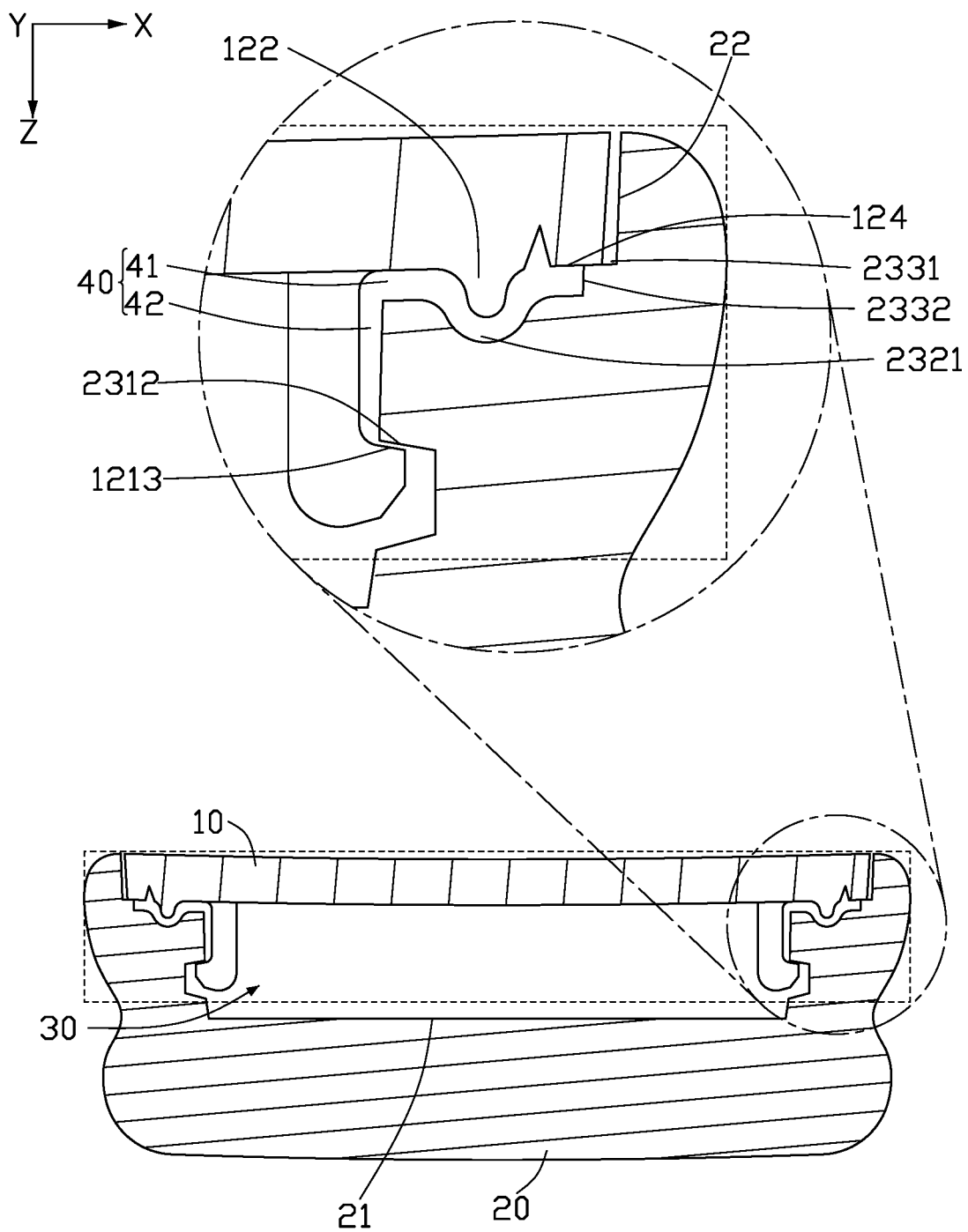
FIG. 4 is a cross-section view of details of the electronic device of FIG. 1 according to the present disclosure.

FIG. 1 shows an electronic device 100. The electronic device 100 includes a shell assembly 200 and function components (not shown). The shell assembly 200 includes an upper shell 10 and a lower shell 20. The upper shell 10 cooperates with the lower shell 20 to form an enclosed space 30 (as shown in FIG. 4) for receiving the function components.

The electronic device 100 can be an electronic device with human-computer interaction capability, such as a mobile phone, a tablet, an Ultra-Wide Band (UWB) electronic tag, not being limited. The function components are used for implementing human-computer interaction of the electronic device 100. The shell assembly 200 protects the internal components.

The function components are connected with the shell assembly 200 by a pasting manner, a clamping manner, and the like.

Figure 2:
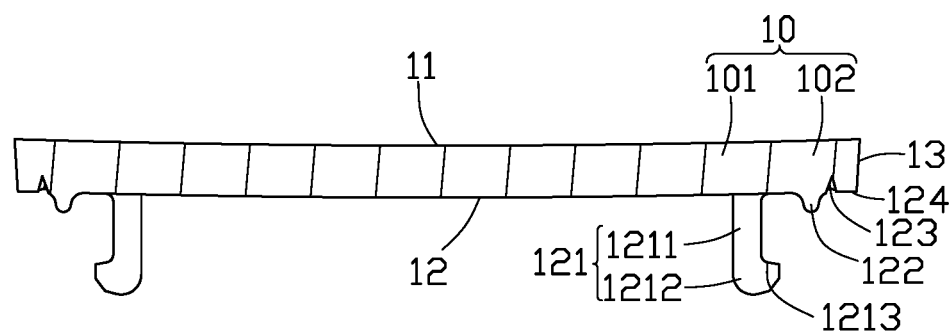
FIG. 2 is a cross-section view of the upper shell of FIG. 1 according to the present disclosure.

FIG. 2 shows a cross-section of the electronic device 100. The upper shell 10 includes a first surface 11, a second surface 12 opposite to the first surface 11, and an outer surface 13 surrounding and connecting with the first surface 11 and the second surface 12. The second surface 12 includes a plurality of hooks 121 along a first direction, such as a Z axis direction. Each hook 121 includes an extended portion 1211 and a hook portion 1212. The extended portion 1211 is perpendicularly disposed on the second surface 12. The hook portion 1212 is disposed on an end of the extended portion 1211 away from the second surface 12, and bent outwards to face the outer surface 13. The hook portion 1212 includes a first connecting surface 1213 adjacent to the second surface 12. The second surface 12 is distanced from the first connecting surface 1213.

The upper shell 10 includes a main portion 101 and an edge portion 102, which are divided by the hook 121. The edge portion 102 is disposed on an outward side of the hook 121, and is adjacent to the outer surface 13. A plurality of protrusion portions 122 are disposed on the edge portion 102. The protrusion portions 122 and the hook 121 are disposed on the second surface 12 at a same side, and are distanced from each other. Recessed portions 123 and a second connecting surface 124 are also disposed on the same side of the second surface 12. The recessed portion 123 is distanced from the hook 121 and is adjacent to the outer surface 13. The recessed portion 123 is formed by creating a concavity in the second surface 12 facing to the first surface 11. The second connecting surface 124 is connected with the edge of the recessed portion 123 and the outer surface 13. The outer surface 13, the second connecting surface 124, the recessed portion 123, and the protrusion portion 122 can be connected in that order.

Figure 3:
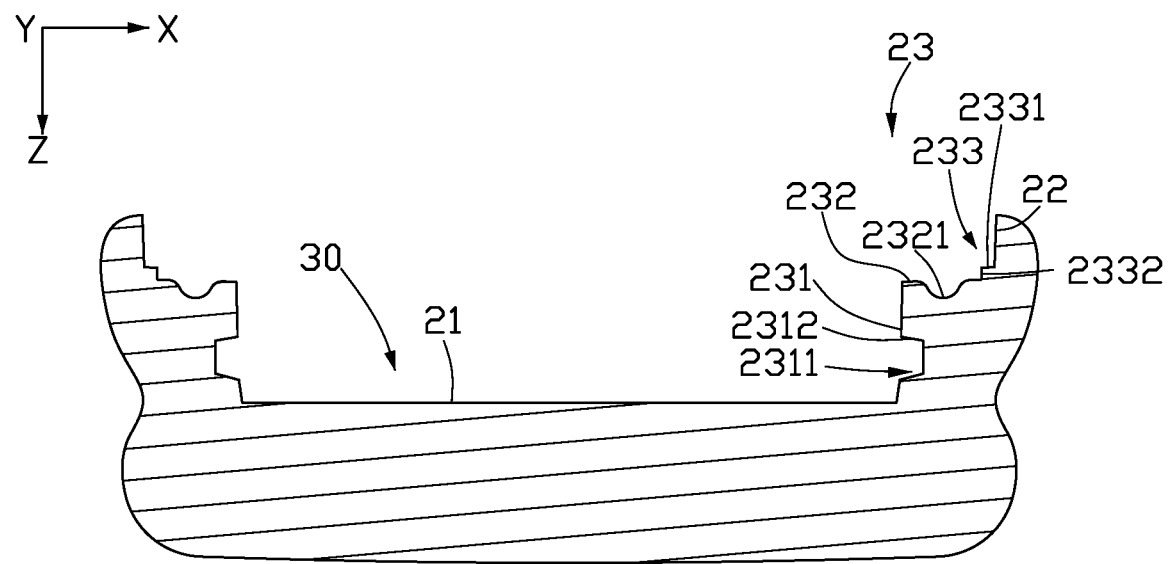
FIG. 3 is a cross-section view of the lower shell of FIG. 1 according to the present disclosure.

FIGS. 3 and 4 show the lower shell 20 and the electronic device 100. The enclosed space 30 is formed by making the lower shell 20 concave in relation to the upper shell 10 along a second direction (such as a direction perpendicular to the upper shell 10). An inner bottom surface 21 and a first blocking surface 22 are defined for forming the receiving space 30. The inner bottom surface 21 is perpendicular to the first blocking surface 22. A first stepped portion 23 is formed at a connection portion between the inner bottom surface 21 and the first blocking surface 22.

The first stepped portion 23 includes a first side 231 and a second side 232 perpendicular to the first side 231. The first side 231 is perpendicular to the inner bottom surface 21. The second side 232 is parallel with the inner bottom surface 21. A height of the second side 232 is greater than that of the inner bottom surface 21. The second side 232 is used for loading the edge portion 102 after assembling the upper shell 10 and the lower shell 20. Thus, the upper shell 10 is disposed on the second side 232, and the inner bottom surface 21, the first side 231, and the second surface 12 cooperate with each other to form the enclosed space 30.

In one embodiment, a second stepped portion 233 is formed at the connection portion between the second side 232 and the first blocking surface 22. The second stepped portion 233 includes a stepped connecting portion 2331 and a second blocking surface 2332. The stepped connecting portion 2331 is substantially perpendicular to the second blocking surface 2332, and is substantially parallel with the second side 232. Along a Z axis direction, a height of the stepped connecting portion 2331 is greater than that of the second side 232. A height of a top end of the first blocking surface 22 (away from the inner bottom surface 21) is greater than that of the stepped connecting surface 2331. The first blocking surface 22, the stepped connecting surface 2331, the second blocking surface 2332, the second side 232, the first side 231, and the inner bottom surface 21 are connected in that order. The height of the stepped connecting surface 2331 is greater than that of the second side 232.

After assembling the upper shell 10 and the lower shell 20 together, the second connecting surface 124 of the edge portion 102 is in direct contact with the stepped connecting surface 2331 of the second stepped portion 233. The upper shell 10 is disposed on the stepped connecting surface 2331. A first gap 41 is formed between the second surface 12 and the second side 232. In one embodiment, slots 2311 are defined at the first side 231 along the first blocking surface 22. A slot connecting surface 2312 forming an upper edge of the slot 2311 along an X axis is distanced from the inner bottom surface 21. The slot 2311 functions as a clamp for the corresponding hook 121. After assembling the upper shell 10 and the lower shell 20, the hook 121 is received in the slot 2311, and the first connecting surface 1213 of the hook 121 resists the slot connecting surface 2312 of the slot 2311. A second gap 42 is formed between the first side 231 and a side of the hook 121 adjacent to the first stepped portion 23.

In some embodiments, a contacting length between the first connecting surface 1213 and the slot connecting surface 2312 along the X axis is not less than 0.25 millimeter (mm).

In one embodiment, the second surface 12 and the second side 232 are distanced from each other to form the first gap 41. The side of the hook 121 adjacent to the first stepped portion 23 and the first side 231 are distanced from each other to form the second gap 42. The side of the hook 121 adjacent to the first stepped portion 23, the first side 231, the second side 232, the second blocking surface 2332, and the second surface 12 cooperate with each other to form a receiving space 40. The receiving space 40 includes the first gap 41 and the second gap 42, communicating with each other.

In another embodiment, after assembling the upper shell 10 and the lower shell 20, a side of the extended portion 1211 adjacent to the edge portion 102 is in direct contact with the first side 231. The second gap 42 is removed. Thus, the second surface 12 (a side of the edge portion 102 facing the second surface 12), the side of the hook 121 adjacent to the first stepped portion 23, the second side 232, and the second blocking surface 2332 cooperate with each other to form the receiving space 40.

In another embodiment, the second stepped portion 233 can be removed. The side of the edge portion 102 facing the second surface 12 is in direct contact with the second side 232. The first gap 41 is removed. Thus, the second surface 12 (a side of the edge portion 102 facing the second surface 12), the side of the hook 121 adjacent to the first stepped portion 23, the first connecting surface 1213, and the first side 231 would cooperate with each other to form the receiving space 40.

The receiving space 40 can receive an adhesive (not shown). The upper shell 10 and the lower shell 20 are combined together by the adhesive.

In one embodiment, the adhesive can be glue, not being limited. An original state of the adhesive can be a fluid, and after being solidified, the upper shell 10 and the lower shell 20 are assembled together and form the enclosed space 30. Thus, an air tightness of the electronic device 100 is achieved.

The hook 121 clamps with the slot 2311, thus a pressure jig is not required. The clamping construction provides the necessary pressure to ensure stability as the adhesive is solidified.

Figure 5:
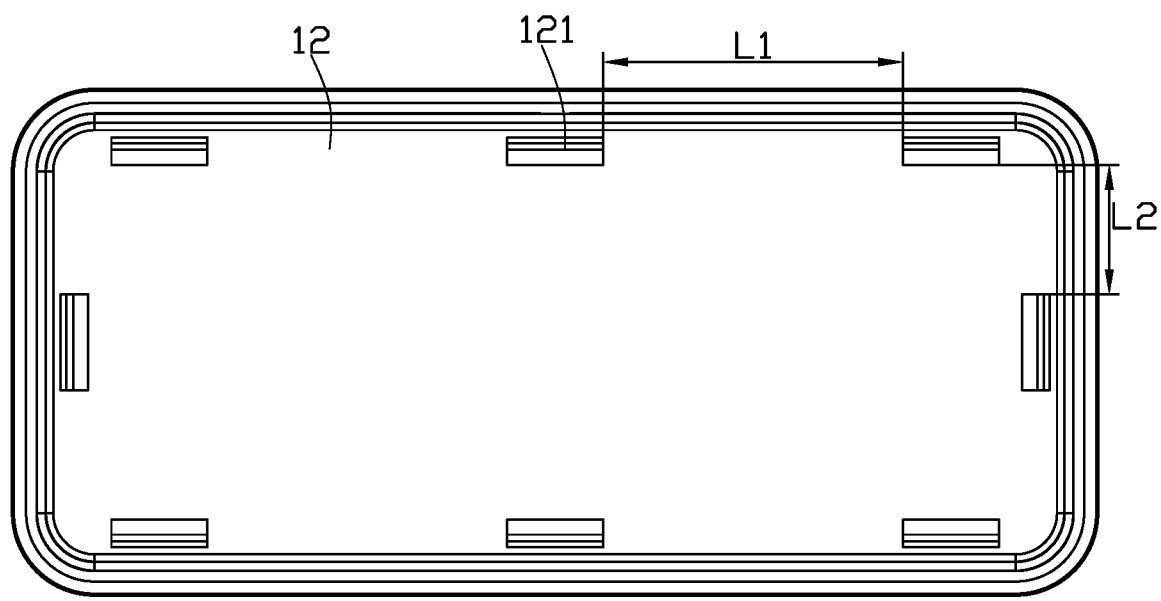
FIG. 5 is diagram illustrating an embodiment of the upper shell of FIG. 1 viewed from another angle according to the present disclosure.

FIG. 5 shows the upper shell 10 from another angle. The upper shell 10 and the lower shell 20 are substantially regular. The hooks 121 are uniformly disposed on edges of the upper shell 10. A first distance L1 between two adjacent hooks 121 on a same side is less than or equal to 20 mm. A second distance L2 between two hooks 121 on different sides is less than or equal to 15 mm. The slot 2311 are uniformly disposed on edges of the lower shell 20.

By setting the first distance, the second distance, and the engagement amount as different distances, a better pressure effect can be achieved.

Referring to FIGS. 2 and 3, the inner bottom surface 21 defines a plurality of concave portions 2321 along the Z axis. The concave portions 2321 cooperate with the protrusion portion 122. After assembling the upper shell 10 and the lower shell 20 together, the protrusion portion 122 is distanced from the concave portion 2321, thus the adhesive in the receiving portion 40 can freely flow between the concave portion 2321 and the protrusion portion 122.

By setting the locations and orientations of concave portion 2321 and the protrusion portion 122, a surface area of the receiving space 40 is increased, and the upper shell 10 and the lower shell 20 are more entirely connected. Thus, the waterproofing function of the electronic device 100 is improved.

Referring to FIGS. 2 to 4 a thickness at the recessed portion 123 can be set to be less than that of other places in the electronic device 100. A construction strength at the edge portion 102 is thus less and deformation is easier. When disassembling the upper shell 10 and the lower shell 20 (such as repairing the electronic device 100), a force can be applied at the edge portion 102. For example, the edge portion 102 can be raised at a gap between the outer surface 13 and the first blocking surface 22.

The shell assembly 200 can be assembled easily without a holding pressure jig by means of the hook 121 and the slot 2311. An assembling process becomes more simple, and a cost while manufacturing the electronic device 100 is reduced.

Besides, many variations and modifications can be made to the above-described embodiment(s) of the disclosure without departing substantially from the spirit and principles of the disclosure. All such modifications and variations are intended to be included herein within the scope of this disclosure and protected by the following claims. The foregoing description, for purpose of explanation, has been described with reference to specific embodiments. However, the illustrative discussions above are not intended to be exhaustive or to act as a limitation on the precise forms disclosed. Many modifications and variations are possible in view of the above teachings. The embodiments were chosen and described in order to best explain the principles of the invention and its practical applications, to thereby enable others skilled in the art to best use the invention and various described embodiments with various modifications as are suited to the particular use contemplated.

What is claimed is:

1. A shell assembly comprising:
    an upper shell, the upper shell comprising a first surface and a second surface; a plurality of hooks being disposed on edges of the second surface; and
    a lower shell, the lower shell comprising an inner bottom surface; a first blocking surface; and a first stepped portion formed at a connection portion between the inner bottom surface and the first blocking surface, wherein the first stepped portion comprises a first side and a second side; the upper shell is disposed on the second side; the first side defines a plurality of slots corresponding to the plurality of hooks; a receiving space is formed by each of the plurality of hooks, the first stepped portion, and the second side;
    wherein a plurality of protrusion portions and a plurality of recessed portions are disposed on the second surface adjacent to the plurality of hooks, the plurality of protrusion portions are positioned between the plurality of hooks and the plurality of recessed portions, the plurality of recessed portions and the plurality of protrusion portions are connected, each of the plurality of recessed portions is a concavity in the second surface facing the first surface;
    a second stepped portion is formed at the connection portion between the second side and the first blocking surface; the second stepped portion comprises a stepped surface and a second blocking surface; the upper shell is disposed on the stepped surface; the second surface is distanced from the second side, the second side, the second blocking surface, and the second surface cooperate with each other to form a partial of the receiving space;
    the inner bottom surface defines a plurality of concave portions corresponding to the plurality of protrusion portions;
    wherein a first gap is formed between the first surface and the second side, and the protrusion portion is distanced from the corresponding concave portion.

2. The shell assembly of claim 1, wherein a slot connecting surface of each of the plurality of slots is disposed adjacent to the upper shell; each of the plurality of hooks comprises an extended portion and a hook portion; the hook portion resists against the slot connecting surface.

3. The shell assembly of claim 2, wherein a contacting length between the hook and the corresponding slot connecting surface along an X axis is not less than 0.25 mm.

4. The shell assembly of claim 1, wherein a side of each of the plurality of hooks adjacent to the first stepped portion is distanced from the first surface, the side of the hook adjacent to the first stepped portion and the second surface cooperate with each other to form a partial of the receiving space.

5. The shell assembly of claim 1, wherein the plurality of hooks are uniformly disposed on edges of the upper shell; a first distance between two adjacent hooks on a same side is less than or equal to 20 mm; a second distance between two hooks on different sides is less than or equal to 15 mm.

6. An electronic device comprise:
    a shell assembly, the shell assembly comprises:
        an upper shell, the upper shell comprising a first surface and a second surface; a plurality of hooks being disposed on edges of the second surface; and
    a lower shell, the lower shell comprising an inner bottom surface; a first blocking surface; a first stepped portion formed at a connection portion between the inner bottom surface and the first blocking surface; wherein the first stepped portion comprises a first side and a second side; the upper shell is disposed on the second side; the first side defines a plurality of slots corresponding to the plurality of hooks; a receiving space is formed by each of the plurality of hooks, the first stepped portion, and the second side;
    wherein a plurality of protrusion portions and a plurality of recessed portions are disposed on the second surface adjacent to the plurality of hooks, the plurality of protrusion portions are positioned between the plurality of hooks and the plurality of recessed portions, the plurality of recessed portions and the plurality of protrusion portions are connected, each of the plurality of recessed portions is a concavity in the second surface facing the first surface;
    a second stepped portion is formed at the connection portion between the second side and the first blocking surface; the second stepped portion comprises a stepped surface and a second blocking surface; the upper shell is disposed on the stepped surface; the second surface is distanced from the second side, the second side, the second blocking surface, and the second surface cooperate with each other to form a partial of the receiving space;

the inner bottom surface defines a plurality of concave portions corresponding to the plurality of protrusion portions;

wherein a first gap is formed between the first surface and the second side, and the protrusion portion is distanced from the corresponding concave portion.

7. The electronic device of claim 6, wherein a slot connecting surface of each of the plurality of slots is disposed adjacent to the upper shell; each of the plurality of hooks comprises an extended portion and a hook portion; the hook portion resists against the slot connecting surface.

8. The electronic device of claim 7, wherein a contacting length between the hook and the corresponding slot connecting surface along an X axis is not less than 0.25 mm.

9. The electronic device of claim 6, wherein a side of each of the plurality of hooks adjacent to the first stepped portion is distanced from the first surface, the side of the hook adjacent to the first stepped portion and the second surface cooperate with each other to form a partial of the receiving space.

10. The electronic device of claim 6, wherein the plurality of hooks are uniformly disposed on edges of the upper shell; a first distance between two adjacent hooks on a same side is less than or equal to 20 mm; a second distance between two hooks on different sides is less than or equal to 15 mm.

* * * * *